United States Patent [19]

Okumura

[11] Patent Number: 4,823,182
[45] Date of Patent: Apr. 18, 1989

[54] SEMICONDUCTOR DEVICE WITH A DIFFUSION BARRIER CONTACT OF A REFRACTORY METAL NITRIDE AND EITHER CARBON OR BORON

[75] Inventor: Katsuya Okumura, Yokohama, Japan
[73] Assignee: Kabushiki Kaisha Toshiba, Kawasaki, Japan
[21] Appl. No.: 123,371
[22] Filed: Nov. 20, 1987
[30] Foreign Application Priority Data
Nov. 21, 1986 [JP] Japan .................................. 61-277956
[51] Int. Cl.$^4$ ............................................. H01L 29/46
[52] U.S. Cl. ........................................ 357/67; 357/71
[58] Field of Search ..................................... 357/67, 71

[56] References Cited
U.S. PATENT DOCUMENTS
4,502,209 3/1985 Eizenberg et al. ..................... 357/67
4,574,298 3/1986 Yamagishi et al. .................... 357/71

FOREIGN PATENT DOCUMENTS
59-111362 6/1984 Japan ..................................... 357/67

Primary Examiner—Andrew J. James
Assistant Examiner—Jerome Jackson, Jr.
Attorney, Agent, or Firm—Finnegan, Henderson, Farabow, Garrett & Dunner

[57] ABSTRACT

A semiconductor device is disclosed, in which a titanium nitride film containing boron or carbon is provided between a semiconductor substrate and an aluminum film. Non-reacted substances in the titanium nitride film are rendered inactive by boron or carbon contained in the titanium nitride film. Thus, it is possible to improve the barrier properties of the titanium nitride film as mutual diffusion prevention film and also ensure good electric conductivity.

9 Claims, 4 Drawing Sheets

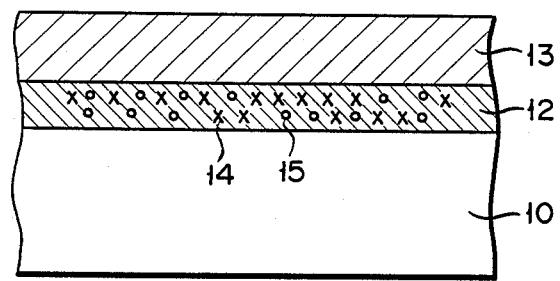
F I G. 2A
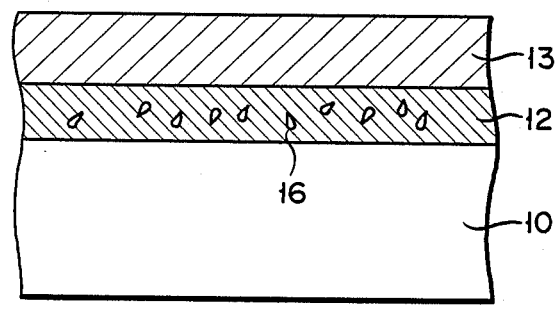
F I G. 2B

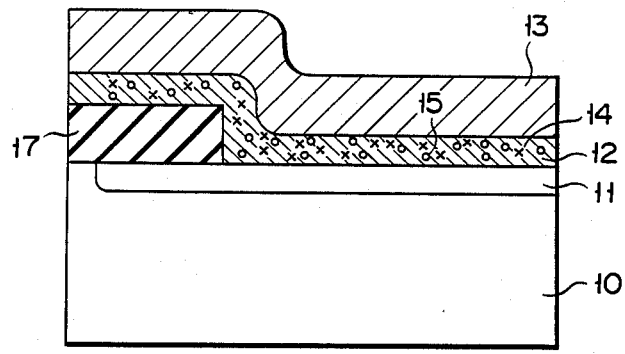
F I G. 3A
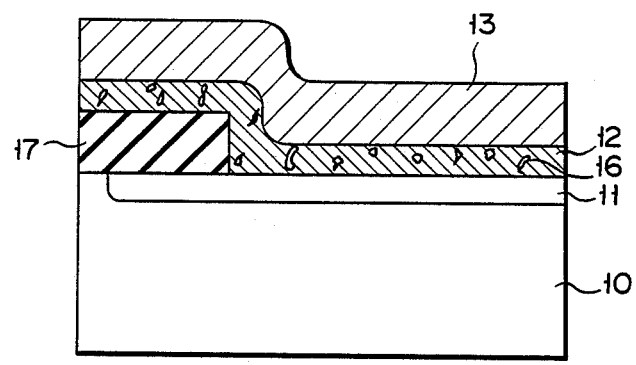
F I G. 3B

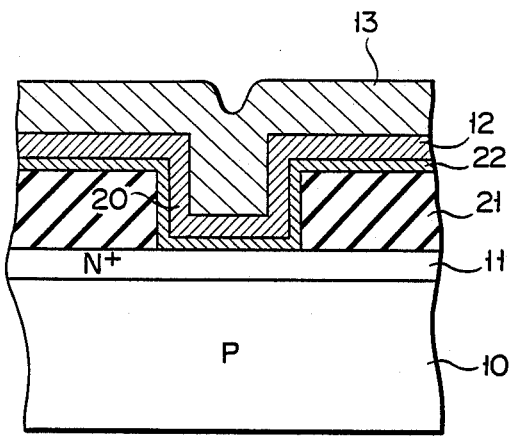
F I G. 4
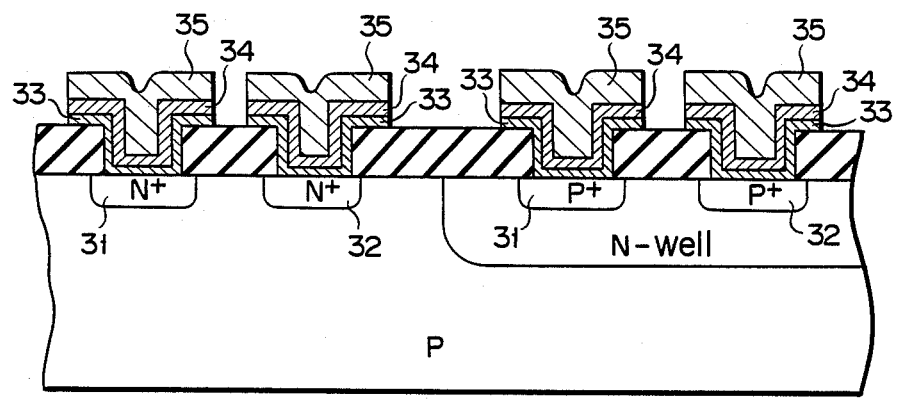
F I G. 5

SEMICONDUCTOR DEVICE WITH A DIFFUSION BARRIER CONTACT OF A REFRACTORY METAL NITRIDE AND EITHER CARBON OR BORON

BACKGROUND OF THE INVENTION

This invention relates to a semiconductor device, which can improve the barrier properties of a diffusion prevention film for preventing the mutual diffusion between silicon and metal and also between metal and metal and ensure satisfactory electric conductivity.

In semiconductor devices, many contact sections or junctions between silicon and metal and between different metals are formed. When such a junction is elevated to a high temperature during manufacture of the semiconductor device, mutual diffusion between silicon and metal or between different metals takes place. In order to prevent mutual diffusion, various diffusion prevention films have been studied. Among the diffusion prevention films that have been studied, the TiN film is thought to be most promising.

Now, an application of the TiN film as a mutual diffusion prevention film between a silicon diffusion layer and an aluminum film will be described. As shown in FIG. 1A, N-type diffusion layer 2 having a junction depth of 0.20 μm is formed in P-type silicon substrate 1. Silicon oxide film 7 is formed by the CVD process on the surface of substrate 1. Then, oxide film 7 is selectively removed using a photoresist (not shown) as a mask to expose corresponding portions of diffusion layer 2. Thereafter, titanium nitride film 3 having a thickness of 1,000 angstroms is formed on diffusion layer 2 and oxide film 7. Then, an aluminum film 4 with a thickness of 1 μm is formed on titanium nitride film 3.

Titanium nitride film 3 is formed in a sputtering process in Ar/N$_2$ mixture plasma (N$_2$:60%) using a titanium target.

Aluminum film 4 and titanium nitride film 3 are patterned to form a diode, and the junction leak current therein is measured.

The resultant structure is annealed at 500° C. for 30 minutes before measurement of the junction leak current, and an abnormal junction leak current is measured.

When a defective portion is observed in detail, a small alloy pit was found in diffusion region 2. It is found that the junction is damaged by this alloy pit due to the following reason. Barrier properties of titanium nitride (TiN) film 3 are lost by a certain reason, and mutual diffusion between aluminum (Al) and silicon (Si) locally occurs.

The cause of the alloy pit will be described with reference to FIG. 1B. A small amount of non-reacted titanium 5 is present in titanium nitride (TiN) film 3. Titanium nitride film 3 is polycrystalline and non-reacted titanium 5 gathers on a grain boundary of the crystal grains constituting titanium nitride film 3. Al-Si mutual diffusion is accelerated through non-reacted titanium 5 gathering on the grain boundary, and alloy pit 6 is formed. As a result, junction leakage occurs.

SUMMARY OF THE INVENTION

An object of the invention is to provide a semiconductor device, which can improve the barrier properties of the diffusion prevention film for preventing the mutual diffusion between silicon and metal and also between different metals and ensure satisfactory electric conductivity.

According to the invention, use is made of a nitride of a high melting point metal, containing boron or carbon, as a film for preventing mutual diffusion between silicon and metal and also between two different metals.

According to the invention, non-reacted substances in the nitride of a high melting point metal are rendered inactive by boron or carbon contained in the nitride of a high melting point metal. Consequently, it is possible to improve the barrier, properties of the nitride of a high melting point metal and ensure satisfactory electric conductivity.

BRIEF DESCRIPTION OF THE DRAWINGS

FIG. 2A is a sectional view of a semiconductor device according to the present invention;

FIG. 2B is a sectional view showing a state after the semiconductor device of FIG. 2A is annealed;

FIG. 3A is a sectional view of a semiconductor device having a diode structure using a carbon-containing titanium nitride film;

FIG. 3B is a sectional view showing a state wherein the semiconductor device of FIG. 3A is annealed to cause non-reacted titanium to react with carbon to obtain titanium carbide;

FIG. 4 is a sectional view of a semiconductor device having a diode structure by using a titanium film and a titanium nitride film; and FIG. 5 is a sectional view of a semiconductor device having a CMOS structure by using a titanium film and a titanium nitride film.

DETAILED DESCRIPTION OF THE PREFERRED EMBODIMENTS

Figure 1A:
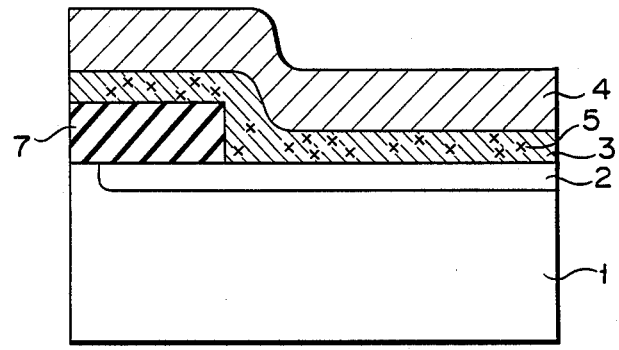
FIG. 1A is a sectional view of a conventional semiconductor device having a titanium nitride film.
Figure 1B:
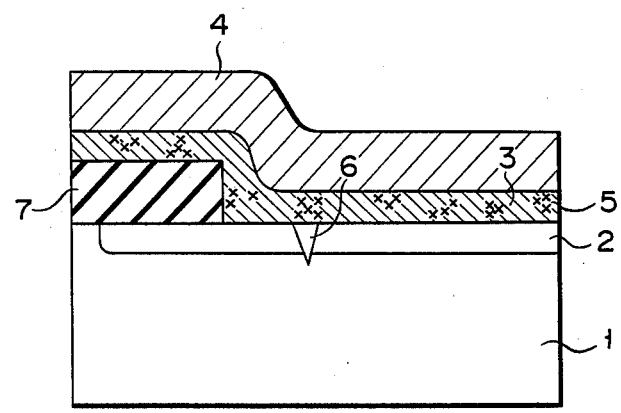
FIG. 1B is a sectional view for explaining formation of an alloy pit in the conventional semiconductor device shown in FIG. 1A.

A semiconductor device having a nitride of a high melting point metal according to a first embodiment will be described below.

As shown in FIG. 2A, titanium nitride film 12 having a thickness of 1,000 Å and serving as a nitride of a high melting point metal is formed on P-type silicon substrate 10. Aluminum film 13 is formed on titanium nitride film 12.

Titanium nitride film 12 is formed by chemical sputtering using a titanium target. Sputtering is performed in on N$_2$/Ar/CH$_4$ mixture plasma of a gas mixture of N$_2$ (nitrogen), Ar (argon), and CH$_4$ (methane) at an N$_2$/Ar/CH$_4$ volume ratio of 20/20/3 SCCM and a total pressure of $3 \times 10^{-1}$ Pa.

Non-reacted titanium 14 and carbon 15 are contained in titanium nitride film 12.

Aluminum film 13 is formed on titanium nitride film 12. After aluminum film 13 is formed, the resultant structure is heat-treated or annealed at 500° C. for 30 minutes. Aluminum film 13 and titanium nitride film 12 are removed and the number of alloy pits is measured with a microscope. No pits are observed.

The alloy pit is not formed due to the following reason, as shown in FIG. 2B. Non-reacted titanium 14 in titanium nitride film 12 reacts with carbon 15 to form titanium carbide (TiC) 16.

The resultant structure is annealed at 500° C. for 30 minutes, and an increase in the leak current is not measured. Since titanium is reacted with carbon at 200° C. to 400° C., titanium and carbon are converted into titanium carbide (TiC) during annealing at 500° C. for 30 minutes. As a result, improvement of the barrier properties of the nitride film has been completed.

When titanium nitride film 12 is formed by chemical sputtering using a plasma of an $N_2/Ar$ gas mixture and a titanium target, i.e., when methane is not used, alloy pits are formed at a rate of 200 pits/mm$^2$.

In order to examine the junction leak current characteristic of the titanium nitride film formed in this embodiment, fabrication of a semiconductor device having a diode structure shown in FIG. 3A will be described.

Referring to FIG. 3A, N-type diffusion layer 11 having a junction depth of 0.2 μm is formed in P-type silicon substrate 10. Silicon oxide film 17 is formed on diffusion layer 11 and silicon substrate 10 by CVD (Chemical Vapor Deposition). A photoresist pattern (not shown) is formed on silicon oxide film 17, and silicon oxide film 17 is selectively etched using the photoresist pattern as a mask, thereby exposing diffusion layer 11.

1,000-Å thick titanium nitride film 12 as a nitride of a high melting point metal is formed on diffusion layer 11 and oxide film 17. Aluminum film 13 is formed on titanium nitride film 12.

Titanium nitride film 12 is formed by mixing carbon therein, as previously described.

In this case, non-reacted titanium and carbon are present in titanium nitride film 12 shown in FIG. 3A.

Therefore, the non-reacted titanium and carbon are reacted with each other during annealing at 500° C. for 30 minutes to obtain titanium carbide 16 shown in FIG. 3B. In a diode structure shown in FIG. 3B, even if annealing is performed at 500° C. for 30 minutes prior to junction leak current measurement, no junction leakage is detected.

According to a second embodiment, a titanium nitride film is formed on a silicon substrate by chemical sputtering in a plasma generated by using a titanium target in an $Ar/N_2$ gas mixture containing diborane ($B_2H_2$) in place of methane ($CH_4$) in the same amount of methane. An aluminum film is formed on the titanium nitride film to bond non-reacted titanium in the titanium nitride film to boron, and titanium boride (TiB$_2$) is formed. In this case, the barrier properties of the titanium nitride film can be improved, and no alloy pits are formed.

In the second embodiment, since the alloy pit is not formed, the junction leak current property of the titanium nitride film can be improved.

In practice, a diode structure as in the first embodiment is formed in order to evaluate the barrier properties of the titanium nitride film, and the resultant structure is annealed at 500° C. for 30 minutes. In this case, no junction leakage is detected, and the barrier properties of the titanium nitride film can be greatly improved.

According to a third embodiment, a titanium nitride film is formed on a silicon substrate by sputtering in a plasma generated by using an Ar (argon)/N$_2$ (nitrogen) gas mixture (N$_2$:60%) when a titanium target containing 0.3% of boron is used. An aluminum film is formed on the titanium nitride film. The titanium nitride film is annealed to cause the non-reacted titanium in the titanium nitride film to react with boron to obtain titanium boride (TiB$_2$).

In order to evaluate the barrier properties of the titanium nitride film in the same manner as in the first and second embodiments, the resultant structure is annealed at 500° C. for 30 minutes. No junction leakage occurs, and the barrier properties of the titanium nitride film can be greatly improved.

In the first to third embodiments, the non-reacted titanium in each titanium nitride film is reacted with boron or carbon to produce titanium boride (TiB$_2$) or titanium carbide (TiC) at a temperature of about 300° C. The substrate may be kept at a temperature of 300° to 400° C. during formation of the titanium nitride film, and titanium boride (TiB$_2$) or titanium carbide (TiC) may be formed simultaneously when the titanium nitride film is deposited. After the titanium nitride film may be deposited, the resultant structure may be annealed and the aluminum film may be deposited thereon. Boron or carbon may be contained in the titanium target in the form of titanium boride (TiB$_2$) or titanium carbide (TiC). Alternatively, boron or carbon may be contained in the form of a boron or carbon compound excluding titanium boride (TiB$_2$) or titanium carbide (TiC) to improve the barrier properties of the titanium nitride film. A target may be obtained by a combination of boron or carbon and titanium which does not contain boron or carbon, or a combination of titanium which does not contain titanium or carbon and a compound containing boron or carbon (e.g., titanium boride (TiB$_2$), titanium carbide (TiC), or BN (boron nitride)).

A fourth embodiment of the present invention will be described below. A titanium nitride film is formed on a silicon substrate by an N$_2$ (nitrogen)/Ar (argon) mixture plasma generated by using a titanium target which does not contain boron. Boron ions are implanted in the titanium nitride film. An aluminum film is formed on the titanium nitride film. The resultant structure is annealed at 450° C. to cause the non-reacted titanium to react with boron to form titanium boride (TiB$_2$), thereby inactivating titanium.

When a dose of boron ions implanted in the titanium nitride film is set to be $1 \times 10^{14}$ atoms/cm$^2$, alloy pits are formed at a density of 100 pits/mm$^2$. Similarly, when a dose of boron ions is set to be $1 \times 10^{15}$ atoms/mm$^2$, the alloy pits are formed at a density of 5 pits/mm$^2$.

In the fourth embodiment, a diode structure is prepared and annealed at 500° C. for 30 minutes. No leak current is detected, and the barrier properties of the titanium nitride film can be greatly improved.

On the contrary, when ion implantation of boron is not performed, the alloy pits are formed at a density of 200 pits/mm$^2$.

As compared with the case wherein boron is not contained in the titanium nitride film, the boron-containing titanium nitride film has a better junction leak current characteristic.

In the first to fourth embodiments, when the substrate is heated during formation of the titanium nitride film, resistivity ρ is as low as 180 μΩcm. However, when the titanium nitride film is formed while the substrate is not heated, resistivity ρ is 400 μΩcm. Therefore, the resistivity can be decreased when the substrate is heated during formation of the titanium nitride film, and a better result is obtained.

According to the present invention, both boron and carbon can be contained in the titanium film and the resultant film can be so annealed as to improve the electrical characteristics such as the junction leak current characteristic.

A structure is shown in FIG. 4 wherein a titanium film is formed between a carbon-containing titanium nitride film and an N$^+$-type diffusion layer. This diode structure can be formed in the following process. Arsenic (Ar) ions are implanted in P-type silicon substrate 10 at an acceleration voltage of 40 keV and a dose of $5 \times 10^{15}$ atoms/cm$^2$ to form N$^+$-type high-impurity semiconductor layer 11. Silicon oxide (SiO$_2$) film 21 having contact hole 20 is formed on N$^+$-type layer 2. Contact hole 20 has an area of 1 μm×1 μm. 500-Å thick titanium (Ti) film 22 is formed on the exposed portion of N$^+$-type layer 2 and on SiO$_2$ film 21. 1,000-Å thick carbon-containing titanium nitride film 12 is formed on titanium film 22 while the substrate is heated at 300° C. Aluminum (Al) film 13 is formed on titanium nitride film 12. The resultant structure is annealed at 500° C. for 30 minutes to convert titanium into titanium silicide (TiSi$_2$).

In the diode structure prepared as described above, a contact resistance between the titanium nitride film and the titanium film (in practice, a titanium silicide film is formed) is measured to be 10 to 15 Ω.

This measurement result entails the following facts.

A contact resistance of a diode structure (FIG. 4) prepared by using a titanium film but not using a titanium nitride film which does not contain carbon is also 10 to 15 Ω.

Even if the diode structure is obtained by using the carbon-containing titanium nitride film and the titanium film, the contact resistance characteristic is not degraded but is kept unchanged.

In addition, since the junction leak current characteristic is improved by use of the carbon-containing titanium nitride film, use of the titanium film and the carbon-containing titanium nitride film, as shown in FIG. 4, can improve the electrical characteristics of the element.

BF$_2$ ions are implanted in an N-type silicon substrate at an acceleration voltage of 50 keV and a dose of $5 \times 10^{15}$ atoms/cm$^2$ to form a P$^+$-type layer. Following the same procedures as in FIG. 4, a silicon oxide (SiO$_2$) film, a titanium (Ti) film, and a carbon-containing titanium nitride film, and an aluminum (Al) film are sequentially formed on the substrate. A contact resistance of the carbon-containing titanium nitride film is measured to be 30 to 50 Ω.

In this case, as compared with the conventional titanium nitride film which does not contain carbon, the electrical characteristics of the titanium nitride film which contains carbon are not degraded.

The substrate may be heated to 400° C. to 500° C. during deposition of the titanium film to convert titanium into titanium silicide. Thereafter, a carbon-containing titanium nitride film may be deposited. Alternatively, a titanium silicide film may be directly deposited in place of the titanium film.

The same contact resistance characteristics as described above can be obtained when a cobalt film is used in place of the titanium film. The same contact resistance characteristics as described above can also be obtained when a titanium silicide film or a cobalt silicide film is used.

FIG. 5 shows a structure wherein the semiconductor device of the present invention is applied to an LSI having a CMOS structure.

500-Å thick titanium film 33 (this film is converted into a titanium silicide film after deposition) at a substrate temperature of 500° C., 1,000-Å thick titanium nitride film 34 prepared by chemical sputtering using a titanium target while a nitrogen/argon/propane plasma is generated at an N$_2$/Ar/CH$_4$ volume ratio of 20/20/3 SCCH and a total pressure of $3 \times 10^{-1}$ Pa and the substrate is kept at 300° C., 0.8-μm thick Al film 35 (or Al-Si alloy film or an Al-Si-Cu alloy film) are formed on source and drain regions 31 and 32 of an N-channel FET and source and drain regions 31 and 32 of a P-channel FET.

When boron ions are implanted in the carbon-containing titanium nitride film, the barrier properties of the film are not degraded. It is therefore apparent that both carbon and boron may be contained in the titanium nitride film.

In the first to fourth embodiments, the contact leak current, the resistivity, and the contact resistance of the barrier film formed between the silicon diffusion layer and the aluminum film are evaluated. However, the TiN film of the present invention is also effective as a diffusion prevention film formed between layers of metals, e.g., between titanium silicide (TiSi$_2$) and aluminum (Al) or between titanium silicide (TiSi$_2$) and tungsten (W) in another metal system. In this system, the excellent barrier properties of the TiN film can be maintained at a high temperature of 900° C. The TiN film may also be used as a metal diffusion prevention film for a semiconductor substrate made of a material (e.g., gallium arsenide (GaAs)) excluding silicon.

Although titanium is used in the foregoing embodiments in the nitride of the high melting point metal, hafnium (Hf) and tungsten (W) can also be used for this purpose.

What is claimed is:

1. A semiconductor device comprising:
   a semiconductor substrate of a first conductivity type which has a surface layer with an impurity region of a second conductivity type;
   a nitride of a high melting point metal formed on said semiconductor substrate and containing at least one of boron and carbon; and
   a metal film formed on said nitride of a high melting point metal.

2. A device according to claim 1, wherein said nitride of a high melting point metal is titanium nitride.

3. A device according to claim 1, wherein said nitride of a high melting point metal is hafnium nitride.

4. A device according to claim 1, wherein said nitride of a high melting point metal is tungsten nitride.

5. A device according to claim 1, wherein said semiconductor substrate is a silicon substrate.

6. A device according to claim 1, wherein said semiconductor substrate is a gallium arsenide substrate.

7. A device according to claim 1, wherein said metal film is aluminum.

8. A device according to claim 1, wherein a titanium film or a titanium silicide film is formed between said semiconductor substrate and said nitride of a high melting point metal.

9. A device according to claim 1, wherein a cobalt film or a cobalt silicide film is formed between said semiconductor substrate and said nitride of a high melting point metal.

* * * * *